(12) United States Patent
Jin et al.

(10) Patent No.: US 7,676,212 B1
(45) Date of Patent: Mar. 9, 2010

(54) SIGNAL MIXER HAVING A SINGLE-ENDED INPUT AND A DIFFERENTIAL OUTPUT

(75) Inventors: Xiaodong Jin, Sunnyvale, CA (US); Lawrence Tse, Fremont, CA (US)

(73) Assignee: Marvell International Ltd., Hamilton (BM)

( * ) Notice: Subject to any disclaimer, the term of this patent is extended or adjusted under 35 U.S.C. 154(b) by 790 days.

(21) Appl. No.: 11/507,304

(22) Filed: Aug. 21, 2006

Related U.S. Application Data

(63) Continuation of application No. 10/764,580, filed on Jan. 27, 2004, now Pat. No. 7,099,646.

(51) Int. Cl.
*H04B 1/28* (2006.01)
(52) U.S. Cl. .................. 455/313; 455/323; 455/334; 455/318; 455/333; 455/341; 331/117 R; 331/167
(58) Field of Classification Search .............. 455/313, 455/323, 334, 318, 333, 341; 331/117 R, 331/167
See application file for complete search history.

(56) References Cited

U.S. PATENT DOCUMENTS

| 5,280,290 | A * | 1/1994 | Evans .................. 342/128 |
| 5,945,878 | A * | 8/1999 | Westwick et al. ........... 330/301 |
| 6,292,047 | B1 | 9/2001 | Traylor |
| 6,342,804 | B1 | 1/2002 | Havens |
| 6,366,171 | B1 | 4/2002 | Litmanen |
| 6,404,263 | B1 | 6/2002 | Wang |
| 6,469,587 | B2 * | 10/2002 | Scoggins ................ 331/117 R |
| 6,512,408 | B2 | 1/2003 | Lee |
| 6,535,725 | B2 * | 3/2003 | Hatcher et al. .............. 455/317 |
| 6,970,681 | B2 * | 11/2005 | Darabi et al. ................. 455/73 |
| 2001/0017571 | A1 | 8/2001 | Franck |
| 2003/0112049 | A1 * | 6/2003 | Wang .......................... 327/307 |
| 2005/0099237 | A1 * | 5/2005 | Gutierrez ................ 331/117 R |

OTHER PUBLICATIONS

ANSI/IEEE Std 802.11, 1999 Edition; Information technology—Telecommunications and information exchange between systems—Local and metropolitan area networks—Specific requirements—Part 11: Wireless LAN Medium Access Control (MAC) and Physical Layer (PHY) Specifications; LAN/MAN Standards Committee of the IEEE Computer Society; 528 pages.

(Continued)

*Primary Examiner*—Sanh D Phu

(57) ABSTRACT

A mixer comprises a differential input circuit that is configured to receive an input signal. The mixer comprises a tank circuit including a tuning capacitor arranged in parallel with an inductor. A resonant frequency of the inductor and tuning capacitor is substantially centered around a predetermined frequency of the input signal. The mixer comprises a mixer circuit that communicates with the differential input circuit and that is configured to receive first and second current signals and a second input signal. The mixer circuit is configured as a Gilbert cell double-balanced switching mixer for generating a differential mixer output signal as a product of the first and second current signals and the second input signal.

27 Claims, 6 Drawing Sheets

OTHER PUBLICATIONS

IEEE Std 802.11a-1999 (Supplement to IEEE Std 802.11-1999) [Adopted by ISO/IEC and redesignated as ISO/IEC 8802-11: 1999/Amd 1:2000(E)]; Supplement to IEEE Standard for Information technology—Telecommunications and information exchange between systems—Local and metropolitan area networks—Specific requirements—Part 11: Wireless LAN Medium Access Control (MAC) and Physical Layer (PHY) specifications High-speed Physical Layer in the 5 GHz Band; LAN/MAN Standards Committee of the IEEE Computer Society; 91 pages.

IEEE Std 802.11b-1999 (Supplement to IEEE Std 802.11-1999 Edition); Supplement to IEEE Standard for Information technology—Telecommunications and information exchange between systems—Local and metropolitan area networks—Specific requirements—Part 11: Wireless LAN Medium Access Control (MAC) and Physical Layer (PHY) specifications: Higher-Speed Physical Layer Extension in the 2.4 GHz Band; LAN/MAN Standards Committee of the IEEE Computer Society; Sep. 16, 1999 IEEE-SA Standards Board; 96 pages.

IEEE Std 802.11g/D2.8, May 2002 (Supplement to ANSI/IEEE Std 802.11, 1999 Edition) DRAFT Supplement to Standard [for] Information Technology—Telecommunications and information exchange between systems—Local and metropolitan area networks—Specific requirements—Part 11: Wireless LAN Medium Access Control (MAC) and Physical Layer (PHY) specifications: Further Higher-Speed Physical Layer Extension in the 2.4 GHz Band; LAN/MAN Standards Committee of the IEEE Computer Society; 53 pages.

IEEE P802.11i/D10.0, Apr. 2004 (Amendment to ANSI/IEEE Std 802.11-1999 (2003 Reaff) edition as amended by IEEE Std 802.11g-2003 and IEEE Std 802.11h-2003)—IEEE Standard for Information technology—Telecommunications and information exhange between systems—Local and metropolitan area networks—Specific requirements. Part 11: Wireless Medium Access Control (MAC) and Physical layer (PHY) specifications: Amendment 6: Medium Access Control (MAC) Security Enhancements. 184 pages.

IEEE P802.11g/D8.2, Apr. 2003 (Supplement to ANSI/IEEE Std 802.11-1999(Reaff 2003)); DRAFT Supplement to STANDARD [for] Information Technology—Telecommunications and information exchange between systems—Local and metropolitan area networks—Specific requirements—Part 11: Wireless LAN Medium Access Control (MAC) and Physical Layer (PHY) specifications: Further Higher Data Rate Extension in the 2.4 GHz Band; LAN/MAN Standards Committee of the IEEE Computer Society; 69 pages.

* cited by examiner

SIGNAL MIXER HAVING A SINGLE-ENDED INPUT AND A DIFFERENTIAL OUTPUT

CROSS REFERENCE TO RELATED APPLICATION

This application is a continuation of U.S. patent application Ser. No. 10/764,580, filed on Jan. 27, 2004, which is incorporated by reference in its entirety.

FIELD OF THE INVENTION

The present invention relates to mixer circuits. More particularly, the present invention relates to a signal mixer having a single-ended input and a differential output.

BACKGROUND OF THE INVENTION

Differential analog circuits have many advantages over single-ended designs that make them desirable to include in electronic systems. In particular, differential circuits have larger dynamic range, better common-mode and power supply rejection, and suppression of even-ordered distortion products. Most analog and radio frequency (RF) circuitry signals are single-ended at the board level, because of the difficulty in matching components and the requirement of doubling the number of components to implement a differential circuit. Therefore, analog and RF applications typically perform a single-ended to differential conversion at the input of the system's integrated circuits.

In low-level RF applications, such as cellular phone, two-way radios, or satellite radio receivers, the signals presented at the input of the radio receiver are very low-level signals, requiring that the single-ended to differential conversion be performed with high linearity and little noise added. Many conventional mixers are designed to receive a differential input, because differential signals aid in decoupling the system from noise in the integrated circuit substrate, thereby lowering the system noise figure, and making the circuit more immune to noise caused by other components located on the same substrate. Because the mixer is designed to receive a differential signal input, while the antenna generates a single received signal, the system must transform the single-ended signal into a differential signal somewhere between the antenna and the mixer.

For example, many conventional low-noise amplifier (LNA) designs, such as, for example, in monolithic transceiver designs, are differential LNAs that require an external balun or an equivalent transformer to convert the single-ended signal into a differential signal. A balun is a device that is used to convert an unbalanced signal to a balanced one, or vice versa. However, the use of a balun can introduce approximately 0.5-1.0 dB of loss into the system. A differential LNA can also exhibit more noise than a single-ended LNA, if the power consumption is the same.

Alternatively, a single-ended LNA can supply a single-ended signal to the mixer. FIG. 1 is a circuit diagram illustrating a mixer 100 that can be used in radio frequency communication systems. Mixer 100 includes a mixer section 101, comprised of transistors Q1, Q2, Q3 and Q4, and a radio frequency (RF) input section 102, comprised of transistors Q5 and Q6. Transistors Q5 and Q6 are configured as a differential amplifier. $V_{RF}$ is the single-ended voltage signal supplied from the LNA to one side of the RF input section 102, while the other side of the RF input section 102 can be AC grounded. RF input section 102 converts the single-ended voltage signal $V_{RF}$ into two output currents, $I_{OUT1}$ and $I_{OUT2}$.

The mixer section 101 is a Gilbert-cell type double-balanced switching mixer. The mixer section 101 mixes the two output currents with a supplied local oscillator signal $V_{LO}$ to generate the differential mixed output signal at terminals 125.

The RF input section 102 includes first resistor 105 and second resistor 110 connected to the emitters of transistors Q5 and Q6, respectively. First and second resistors 105 and 110 are degeneration resistors that serve to reduce the gain and improve the input linearity of the differential amplifier of the RF input section 102. Increasing the size of first and second resistors 105 and 110 can improve linearity, but at the cost of gain. The tail ends of first and second resistors 105 and 110 can be connected to ground, but to improve linearity, the tail ends of first and second resistors 105 and 110 can be connected to an active current source 120. However, the inclusion of the active current source 120 requires that significantly more voltage "head room" be available for operation of the mixer 100. Additionally, active current source 120 can introduce a large junction capacitance from the transistor of the active current source 120. The capacitance can degrade the single-ended-to-differential conversion, because a portion of the input signal will be shunted away by the capacitance of the transistor of the active current source 120.

SUMMARY OF THE INVENTION

A method and system are disclosed for converting a single-ended input signal to a differential output signal. In accordance with exemplary embodiments, according to a first aspect of the present invention, a single-ended-to-differential mixer can include a differential input circuit having a single-ended input. The differential input circuit is responsive to a single-ended input signal to generate first and second signals. The single-ended-to-differential mixer can include a passive tank circuit. The passive tank circuit can be in communication between a reference voltage and the differential input circuit. The single-ended-to-differential mixer can include a mixer circuit. The mixer circuit can be in communication with the differential input circuit and responsive to the first and second signals and a second input signal to generate a differential mixer output signal.

According to the first aspect, the first and second signals can comprise first and second current signals, respectively. The differential input circuit can be configured as a differential amplifier to convert the single-ended input signal from a voltage signal to the first and second current signals. The mixer circuit can be configured as a double-balanced switching mixer for generating the differential mixer output signal as a product of the first and second current signals and the second input signal. According to the first aspect, the differential input circuit can include a first cancellation circuit and a second cancellation circuit. The first and second cancellation circuits can be responsive to the single-ended input signal. The first and second cancellation circuits can be in cross-communication with the differential input circuit. The first and second cancellation circuits can cancel non-linear capacitance associated with the differential input circuit. According to an exemplary embodiment, the first and second cancellation circuits can each comprise a transistor. For each transistor, an emitter of the transistor can be in communication with a base of the transistor. Collectors of the transistors of each of the first and second cancellation circuits can be in cross-communication with collectors of the differential input circuit. According to an exemplary embodiment, the differential input circuit can comprise a first transistor and a second transistor configured as a differential amplifier pair. The single-ended input signal can comprise a single-ended radio frequency input signal. The passive tank circuit can provide a high impedance at a predetermined frequency of the single-ended input signal. The passive tank circuit can comprise an inductor. The passive tank circuit can further comprise a tuning capacitor arranged in parallel with the inductor. A resonant frequency of the inductor and tuning capacitor can be substantially centered around a predetermined frequency of the single-ended input signal. According to an exemplary embodiment, the mixer circuit can comprise a Gilbert cell mixer. The second input signal can comprise a local oscillator signal.

According to the first aspect, the single-ended-to-differential mixer can include a limiter circuit in communication with the mixer circuit and responsive to the local oscillator signal. The limiter circuit can limit a swing range of the local oscillator signal applied to the mixer circuit. The single-ended-to-differential mixer can include a variable load in communication with the mixer circuit and responsive to the differential mixer output signal. The variable load can be configured to cause the gain of the single-ended-to-differential mixer to vary. At least the differential input circuit, the passive tank circuit and the mixer circuit can be formed on a monolithic substrate. For example, a first cancellation circuit and a second cancellation circuit can be formed on the same monolithic substrate. The single-ended-to-differential mixer can comprise a mixer portion of a wireless transceiver. The single-ended-to-differential mixer can be compliant with a standard selected from the group consisting of 802.11, 802.11a, 802.11b, 802.11g and 802.11i.

According to a second aspect of the present invention, a single-ended-to-differential mixer can include a differential input circuit means having a single-ended input means. The differential input circuit means can be responsive to a single-ended input signal to generate first and second signals. The single-ended-to-differential mixer can include a passive tank circuit means. The passive tank circuit means can be in communication between a reference voltage and the differential input circuit means. The single-ended-to-differential mixer can include a mixer circuit means. The mixer circuit means can be in communication with the differential input circuit means and responsive to the first and second signals and a second input signal to generate a differential mixer output signal.

According to the second aspect, the first and second signals can comprise first and second current signals, respectively. The differential input circuit means can be configured as a differential amplifier means to convert the single-ended input signal from a voltage signal to the first and second current signals. The mixer circuit means can be configured as a double-balanced switching mixer means for generating the differential mixer output signal as a product of the first and second current signals and the second input signal. According to the second aspect, the differential input circuit means can include a first cancellation circuit means and a second cancellation circuit means. The first and second cancellation circuit means can be responsive to the single-ended input signal. The first and second cancellation circuit means can be in cross-communication with the differential input circuit means. The first and second cancellation circuit means can cancel non-linear capacitance associated with the differential input circuit means. According to an exemplary embodiment, the first and second cancellation circuit means can each comprise an amplifier means, wherein each amplifier means includes first, second and third electrode means. For each amplifier means, a third electrode means of the amplifier means can be in communication with a second electrode means of the amplifier means. The first electrode means of the amplifier means of each of the first and second cancellation circuit means can be in cross-communication with first electrode means of the differential input circuit. According to an exemplary embodiment, the differential input circuit means can comprise a first amplifier means and a second amplifier means configured as a differential amplifier means. The single-ended input signal can comprise a single-ended radio frequency input signal. The passive tank circuit means can provide a high impedance at a predetermined frequency of the single-ended input signal. According to an exemplary embodiment, the passive tank circuit means can comprise an inductive means. The passive tank circuit means can further comprise a tuning capacitive means arranged in parallel with the inductive means. A resonant frequency of the inductive means and tuning capacitive means can be substantially centered around a predetermined frequency of the single-ended input signal. According to an exemplary embodiment, the mixer circuit means can comprise a Gilbert cell mixer means. The second input signal can comprise a local oscillator signal.

According to the second aspect, the single-ended-to-differential mixer can include a limiter circuit means in communication with the mixer circuit means and responsive to the local oscillator signal. The limiter circuit means can limit a swing range of the local oscillator signal applied to the mixer circuit means. The single-ended-to-differential mixer can include a variable load means in communication with the mixer circuit means and responsive to the differential mixer output signal. The variable load means can be configured to cause the gain of the single-ended-to-differential mixer to vary. At least the differential input circuit means, the passive tank circuit means and the mixer circuit means are formed on a monolithic substrate. For example, the first cancellation circuit means and the second cancellation circuit means can be formed on the same monolithic substrate. The single-ended-to-differential mixer can comprise a mixer portion of a wireless transceiver means. The single-ended-to-differential mixer can be compliant with a standard selected from the group consisting of 802.11, 802.11a, 802.11b, 802.11g and 802.11i.

According to a third aspect of the present invention, a method for converting a single-ended input signal to a differential output signal can include the steps of: i.) providing: a single-ended-to-differential mixer, wherein the single-ended-to-differential mixer comprises: a differential input circuit having a single-ended input; a passive tank circuit, wherein the passive tank circuit is in communication between a reference voltage and the differential input circuit; and a mixer circuit, wherein the mixer circuit is in communication with the differential input circuit; ii.) receiving the single-ended input signal, using the differential input circuit; iii.) converting the single-ended input signal to first and second signals, using the differential input circuit; iv.) receiving the first and second signals and a second input signal, using the mixer circuit; and v.) generating a differential mixer output signal from the first and second signals and the second input signal, using the mixer circuit.

According to the third aspect, the first and second signals can comprise first and second current signals, respectively. The differential input circuit can be configured as a differential amplifier to convert the single-ended input signal from a voltage signal to the first and second current signals. The mixer circuit can be configured as a double-balanced switching mixer for generating the differential mixer output signal as a product of the first and second current signals and the second input signal. According to the third aspect, the method can include the steps of: vi.) providing: a first cancellation circuit and a second cancellation circuit, wherein the first and second cancellation circuits can be responsive to the single-ended input signal, wherein the first and second cancellation circuits are in cross-communication with the differential input circuit; and vii.) canceling non-linear capacitance associated with the differential input circuit, using the first and second cancellation circuits. According to an exemplary embodiment, the first and second cancellation circuits can each comprise a transistor. For each transistor, an emitter of the transistor can be in communication with a base of the transistor. Collectors of the transistors of each of the first and second cancellation circuits can be in cross-communication with collectors of the differential input circuit. The differential input circuit can comprise a first transistor and a second transistor configured as a differential amplifier pair. The single-ended input signal can comprise a single-ended radio frequency input signal. The passive tank circuit can provide a high impedance at a predetermined frequency of the single-ended input signal. According to an exemplary embodiment, the passive tank circuit can comprise an inductor. The passive tank circuit can further comprise a tuning capacitor arranged in parallel with the inductor. A resonant frequency of the inductor and tuning capacitor can be substantially centered around a predetermined frequency of the single-ended input signal. According to an exemplary embodiment, the mixer circuit can comprise a Gilbert cell mixer. The second input signal can comprise a local oscillator signal.

According to the third aspect, the method can include the steps of: viii.) providing: a limiter circuit in communication with the mixer circuit; ix.) limiting a swing range of the local oscillator signal applied to the mixer circuit, using the limiter circuit; x.) providing: a variable load in communication with the mixer circuit and responsive to the differential mixer output signal; and xi.) varying the gain of the single-ended-to-differential mixer, using the variable load. At least the differential input circuit, the passive tank circuit and the mixer circuit can be formed on a monolithic substrate. For example, the first cancellation circuit and the second cancellation circuit can be formed on the same monolithic substrate. The single-ended-to-differential mixer can comprise a mixer portion of a wireless transceiver. The method can be compliant with a standard selected from the group consisting of 802.11, 802.11a, 802.11b, 802.11g and 802.11i.

According to a fourth aspect of the present invention, a single-ended-to-differential mixer can include a differential input circuit having a single-ended input. The differential input circuit can be responsive to a single-ended input signal to generate first and second signals. The single-ended-to-differential mixer can include a first cancellation circuit and a second cancellation circuit. The first and second cancellation circuits can be responsive to the single-ended input signal. The first and second cancellation circuits can be in cross-communication with the differential input circuit. The first and second cancellation circuits can cancel non-linear capacitance associated with the differential input circuit. The single-ended-to-differential mixer can include a mixer circuit. The mixer circuit can be in communication with the differential input circuit and responsive to the first and second signals and a second input signal to generate a differential mixer output signal.

According to the fourth aspect, the differential input circuit can comprise a first transistor and a second transistor configured as a differential amplifier pair. The single-ended input signal can comprise a single-ended radio frequency input signal. The first and second cancellation circuits each can comprise a transistor. For each transistor, an emitter of the transistor can be in communication with a base of the transistor. Collectors of the transistors of each of the first and second cancellation circuits can be in cross-communication with collectors of the differential input circuit. The first and second signals can comprise first and second current signals, respectively. The differential input circuit can be configured as a differential amplifier to convert the single-ended input signal from a voltage signal to the first and second current signals. The mixer circuit can be configured as a double-balanced switching mixer for generating the differential mixer output signal as a product of the first and second current signals and the second input signal. According to the fourth aspect, the differential input circuit can further comprise a passive tank circuit. The passive tank circuit can be in communication between a reference voltage and the differential input circuit. The passive tank circuit can provide a high impedance at a predetermined frequency of the single-ended input signal. The passive tank circuit can comprise an inductor. The passive tank circuit can further comprise a tuning capacitor arranged in parallel with the inductor. A resonant frequency of the inductor and tuning capacitor can be substantially centered around a predetermined frequency of the single-ended input signal.

According to the fourth aspect, the mixer circuit can comprise a Gilbert cell mixer. The second input signal can comprise a local oscillator signal. The single-ended-to-differential mixer can comprise a limiter circuit in communication with the mixer circuit and responsive to the local oscillator signal. The limiter circuit can limit a swing range of the local oscillator signal applied to the mixer circuit. The single-ended-to-differential mixer can comprise a variable load in communication with the mixer circuit and responsive to the differential mixer output signal. The variable load can be configured to cause the gain of the single-ended-to-differential mixer to vary. According to the fourth aspect, at least the differential input circuit, the first and second cancellation circuits, and the mixer circuit can be formed on a monolithic substrate. For example, a passive tank circuit can be formed on the same monolithic substrate. The single-ended-to-differential mixer can comprise a mixer portion of a wireless transceiver. The single-ended-to-differential mixer can be compliant with a standard selected from the group consisting of 802.11, 802.11a, 802.11b, 802.11g and 802.11i.

According to a fifth aspect of the present invention, a single-ended-to-differential mixer can include a differential input circuit means having a single-ended input means. The differential input circuit means can be responsive to a single-ended input signal to generate first and second signals. The single-ended-to-differential mixer can include a first cancellation circuit means and a second cancellation circuit means. The first and second cancellation circuit means can be responsive to the single-ended input signal. The first and second cancellation circuit means can be in cross-communication with the differential input circuit means. The first and second cancellation circuit means can cancel non-linear capacitance associated with the differential input circuit means. The single-ended-to-differential mixer can include a mixer circuit means. The mixer circuit means can be in communication with the differential input circuit means and responsive to the first and second signals and a second input signal to generate a differential mixer output signal.

According to the fifth aspect, the differential input circuit means comprises a first amplifier means and a second amplifier means configured as a differential amplifier means. The single-ended input signal can comprise a single-ended radio frequency input signal. The first and second cancellation circuit means each can comprise an amplifier means. Each amplifier means can include first, second and third electrode means. For each amplifier means, a third electrode means of the amplifier means can be in communication with a second electrode means of the amplifier means. First electrode means of the amplifier means of each of the first and second cancellation circuit means can be in cross-communication with first electrode means of the differential input circuit. According to the fifth aspect, the first and second signals can comprise first and second current signals, respectively. The differential input circuit means can be configured as a differential amplifier means to convert the single-ended input signal from a voltage signal to the first and second current signals. The mixer circuit means can be configured as a double-balanced switching mixer means for generating the differential mixer output signal as a product of the first and second current signals and the second input signal.

According to the fifth aspect, the differential input circuit means can further comprise a passive tank circuit means. The passive tank circuit means can be in communication between a reference voltage and the differential input circuit means. The passive tank circuit means can provide a high impedance at a predetermined frequency of the single-ended input signal. The passive tank circuit means can comprise an inductive means. The passive tank circuit means can further comprise a tuning capacitive means arranged in parallel with the inductive means. A resonant frequency of the inductive means and tuning capacitive means can be substantially centered around a predetermined frequency of the single-ended input signal. The mixer circuit means can comprise a Gilbert cell mixer means. The second input signal can comprise a local oscillator signal. The single-ended-to-differential mixer can include a limiter circuit means in communication with the mixer circuit means and responsive to the local oscillator signal. The limiter circuit means can limit a swing range of the local oscillator signal applied to the mixer circuit means. The single-ended-to-differential mixer can include a variable load means in communication with the mixer circuit means and responsive to the differential mixer output signal. The variable load means can be configured to cause the gain of the single-ended-to-differential mixer to vary. At least the differential input circuit means, the first and second cancellation circuit means and the mixer circuit means can be formed on a monolithic substrate. For example, a passive tank circuit can be formed on the same monolithic substrate. The single-ended-to-differential mixer can comprise a mixer portion of a wireless transceiver means. The single-ended-to-differential mixer can be compliant with a standard selected from the group consisting of 802.11, 802.11a, 802.11b, 802.11g and 802.11i.

According to a sixth aspect of the present invention, a method for converting a single-ended input signal to a differential output signal can include the steps of: i.) providing: a single-ended-to-differential mixer, wherein the single-ended-to-differential mixer comprises: a differential input circuit having a single-ended input; a first cancellation circuit and a second cancellation circuit, wherein the first and second cancellation circuits are in cross-communication with the differential input circuit; and a mixer circuit, wherein the mixer circuit is in communication with the differential input circuit; ii.) receiving the single-ended input signal, using the differential input circuit; iii.) canceling non-linear capacitance associated with the differential input circuit, using the first and second cancellation circuits; iv.) converting the single-ended input signal to first and second signals, using the differential input circuit; and v.) receiving the first and second signals and a second input signal, using the mixer circuit; and vi.) generating a differential mixer output signal from the first and second signals and the second input signal, using the mixer circuit.

According to the sixth aspect, the differential input circuit can comprise a first transistor and a second transistor configured as a differential amplifier pair. The single-ended input signal can comprise a single-ended radio frequency input signal. The first and second cancellation circuits each can comprise a transistor. For each transistor, an emitter of the transistor can be in communication with a base of the transistor. Collectors of the transistors of each of the first and second cancellation circuits can be in cross-communication with collectors of the differential input circuit. According to the sixth aspect, the first and second signals can comprise first and second current signals, respectively. The differential input circuit can be configured as a differential amplifier to convert the single-ended input signal from a voltage signal to the first and second current signals. The mixer circuit can be configured as a double-balanced switching mixer for generating the differential mixer output signal as a product of the first and second current signals and the second input signal. The method can comprise the steps of: vii.) providing: a passive tank circuit, wherein the passive tank circuit is in communication between a reference voltage and the differential input circuit. The passive tank circuit can provide a high impedance at a predetermined frequency of the single-ended input signal. The passive tank circuit comprises an inductor. The passive tank circuit can further comprise a tuning capacitor arranged in parallel with the inductor. A resonant frequency of the inductor and tuning capacitor can be substantially centered around a predetermined frequency of the single-ended input signal.

According to the sixth aspect, the mixer circuit can comprise a Gilbert cell mixer. The second input signal can comprise a local oscillator signal. The method can include the steps of: viii.) providing: a limiter circuit in communication with the mixer circuit; ix.) limiting a swing range of the local oscillator signal applied to the mixer circuit, using the limiter circuit; x.) providing: a variable load in communication with the mixer circuit and responsive to the differential mixer output signal; and xi.) varying the gain of the single-ended-to-differential mixer, using the variable load. At least the differential input circuit, the first and second cancellation circuits, and the mixer circuit can be formed on a monolithic substrate. For example, a passive tank circuit can be formed on the same monolithic substrate. The single-ended-to-differential mixer can comprise a mixer portion of a wireless transceiver. The method can be compliant with a standard selected from the group consisting of 802.11, 802.11a, 802.11b, 802.11g and 802.11i.

According to a seventh aspect of the present invention, a single-ended-to-differential mixer can include a differential input circuit. The differential input circuit can be configured to receive a single-ended input signal. The differential input circuit can comprise a first transistor and a second transistor configured as a differential amplifier to convert the single-ended input signal from a voltage signal to first and second current signals. The differential input circuit can comprise a first cancellation circuit and a second cancellation circuit. The first cancellation circuit can comprise a third transistor. An emitter of the third transistor can be in communication with a base of the third transistor. The second cancellation circuit can comprise a fourth transistor. An emitter of the fourth transistor can be in communication with a base of the fourth transistor. The first and second cancellation circuits can be configured to receive the single-ended input signal. The collectors of the first and second cancellation circuits can be in cross-communication with collectors of the differential amplifier of the differential input circuit. The first and second cancellation circuits can cancel non-linear capacitance associated with the differential amplifier.

According to the seventh aspect, the single-ended-to-differential mixer can include a tank circuit. The tank circuit can include an inductor. The tank circuit can also include a tuning capacitor arranged in parallel with the inductor. A resonant frequency of the inductor and tuning capacitor can be substantially centered around a predetermined frequency of the single-ended input signal. The tank circuit can be in communication between a ground and common emitters of the differential amplifier of the differential input circuit. According to exemplary embodiments, the tank circuit can be configured as a passive current source. The single-ended-to-differential mixer can include a mixer circuit. The mixer circuit can be in communication with the differential input circuit and configured to receive the first and second current signals. The mixer circuit can be configured to receive a second input signal. The mixer circuit can be configured as a Gilbert cell double-balanced switching mixer for generating a differential mixer output signal as a product of the first and second current signals and the second input signal.

According to the seventh aspect, the single-ended input signal can comprise a single-ended radio frequency input signal. The tank circuit can provide a high impedance at the predetermined frequency of the single-ended input signal. The second input signal can comprise a local oscillator signal. The single-ended-to-differential mixer can include a limiter circuit in communication with the mixer circuit and configured to receive the local oscillator signal. The limiter circuit can limit the swing range of the local oscillator signal applied to the mixer circuit. The single-ended-to-differential mixer can include a variable load in communication with the mixer circuit and configured to receive the differential mixer output signal. The variable load can be configured to cause the gain of the single-ended-to-differential mixer to vary. At least the differential input circuit, the tank circuit and the mixer circuit are formed on a monolithic substrate. For example, the first cancellation circuit and the second cancellation circuit can be formed on the same monolithic substrate. The single-ended-to-differential mixer can comprise a mixer portion of a wireless transceiver. The single-ended-to-differential mixer can be compliant with a standard selected from the group consisting of 802.11, 802.11a, 802.11b, 802.11g and 802.11i.

According to an eighth aspect of the present invention, a single-ended-to-differential mixer can include a differential input circuit means. The differential input circuit means can be configured to receive a single-ended input signal. The differential input circuit means can include a first amplifier means and a second amplifier means configured as a differential amplifier means to convert the single-ended input signal from a voltage signal to first and second current signals. Each amplifier means can include first, second and third electrode means. The differential input circuit can also include a first cancellation circuit means and a second cancellation circuit means. The first cancellation circuit means can comprise a third amplifier means. A third electrode means of the third amplifier means can be in communication with a second electrode means of the third amplifier means. The second cancellation circuit means can comprise a fourth amplifier means. A third electrode means of the fourth amplifier means can be in communication with a second electrode means of the fourth amplifier means. The first and second cancellation circuit means can be configured to receive the single-ended input signal. First electrode means of the first and second cancellation circuit means can be in cross-communication with first electrode means of the differential amplifier means of the differential input circuit means. The first and second cancellation circuit means can cancel non-linear capacitance associated with the differential amplifier means.

According to the eighth aspect, the single-ended-to-differential mixer can include a tank circuit means. The tank circuit means can include an inductive means. The tank circuit can also include a tuning capacitive means arranged in parallel with the inductive means. A resonant frequency of the inductive means and tuning capactive means can be substantially centered around a predetermined frequency of the single-ended input signal. The tank circuit means can be in communication between a reference voltage and third electrode means of the differential amplifier means of the differential input circuit means. The tank circuit means can be configured as a passive current source means. The single-ended-to-differential mixer can include a mixer circuit means. The mixer circuit means can be in communication with the differential input circuit means and configured to receive the first and second current signals. The mixer circuit means can be configured to receive a second input signal. The mixer circuit means can be configured as a Gilbert cell double-balanced switching mixer means for generating a differential mixer output signal as a product of the first and second current signals and the second input signal. The single-ended input signal can comprise a single-ended radio frequency input signal. The tank circuit means can provide a high impedance at the predetermined frequency of the single-ended input signal. The second input signal can comprise a local oscillator signal.

According to the eighth aspect, the single-ended-to-differential mixer can include a limiter circuit means in communication with the mixer circuit means and configured to receive the local oscillator signal. The limiter circuit means can limit a swing range of the local oscillator signal applied to the mixer circuit means. The single-ended-to-differential mixer can include a variable load means in communication with the mixer circuit means and configured to receive the differential mixer output signal. The variable load means can be configured to cause the gain of the single-ended-to-differential mixer to vary. At least the differential input circuit means, the tank circuit means and the mixer circuit means can be formed on a monolithic substrate. The first cancellation circuit means and the second cancellation circuit means can be formed on the monolithic substrate. The single-ended-to-differential mixer can comprise a mixer portion of a wireless transceiver means. The single-ended-to-differential mixer can be compliant with a standard selected from the group consisting of 802.11, 802.11a, 802.11b, 802.11g and 802.11i.

BRIEF DESCRIPTION OF THE DRAWINGS

Other objects and advantages of the present invention will become apparent to those skilled in the art upon reading the following detailed description of preferred embodiments, in conjunction with the accompanying drawings, wherein like reference numerals have been used to designate like elements, and wherein.

DETAILED DESCRIPTION OF THE PREFERRED EMBODIMENTS

Figure 1:
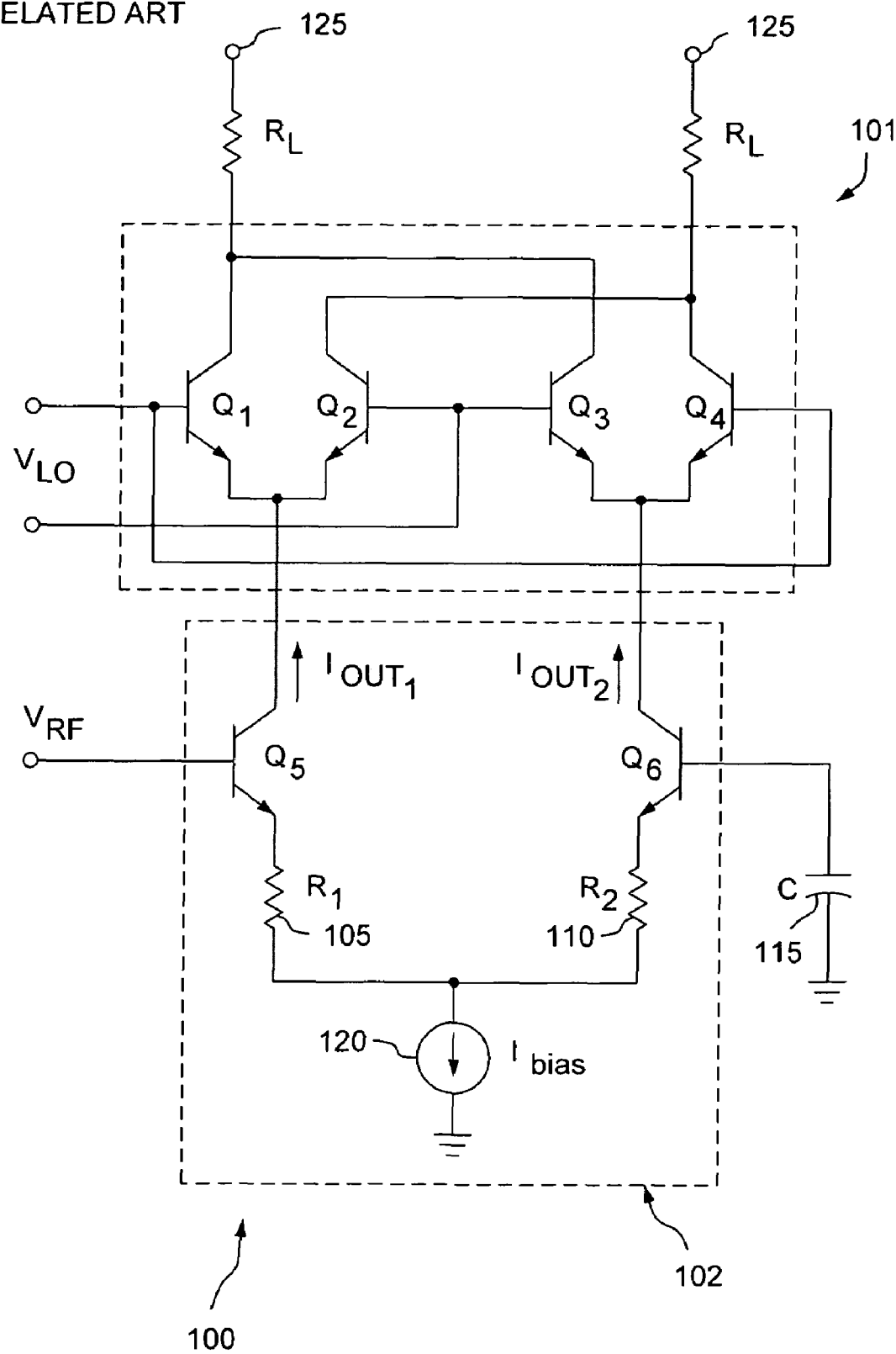
FIG. 1 is a circuit diagram illustrating a mixer that can be used in radio frequency communication systems.

Exemplary embodiments of the present invention are directed to a system and method for converting a single-ended input signal to a differential output signal. According exemplary embodiments, a single-ended-to-differential mixer can include a differential input circuit. The differential input circuit can receive a single-ended input signal, such as a single-ended radio frequency (RF) signal. The differential input circuit can be comprised of two transistors configured as a differential amplifier to convert the single-ended input signal from a voltage signal into two current signals. According to an exemplary embodiment of the present invention, the differential input circuit can include a first and second cancellation circuits. The cancellation circuits are configured to receive the single-ended input signal. Each of the cancellation circuits can be comprised of a transistor in which the emitter of the transistor is coupled to the base of the transistor. The collectors of the first and second cancellation circuits are in cross-communication with collectors of the differential amplifier of the differential input circuit. In such a configuration, the first and second cancellation circuits can cancel non-linear capacitance associated with the differential amplifier, e.g., the collector-to-base junction capacitance, commonly referred to as the Cμ capacitance (also referred to as "feed-forward capacitance"). The use of the cancellation circuits can improve the linearity performance of the single-ended-to-differential mixer.

The single-ended-to-differential mixer can include a tank circuit. The tank circuit is in communication between a reference voltage (e.g., ground) and common emitters of the differential amplifier of the differential input circuit. According to exemplary embodiments, the tank circuit is configured as a passive current source. According to an exemplary embodiment, the tank circuit can comprise an inductor and a tuning capacitor arranged in parallel with the inductor. The resonant frequency of the parallel inductor and tuning capacitor can be substantially centered around a predetermined frequency of the single-ended input signal. At the predetermined frequency, the tank circuit can provide a high impedance, so as to act as a current source at the resonant frequency, while requiring only minimal voltage headroom. The tank circuit according to exemplary embodiments can improve both the common mode rejection and linearity of the single-ended-to-differential mixer, while allowing the system to maintain a high gain.

The single-ended-to-differential mixer can also include a mixer circuit. The mixer circuit is in communication with the differential input circuit and receives the two current signals. The mixer circuit can receive a second input signal, such as a local oscillator signal. The mixer circuit can be configured as a Gilbert-cell double-balanced switching mixer for generating a differential mixer output signal as a product of the two current signals and the local oscillator signal.

Figure 2:
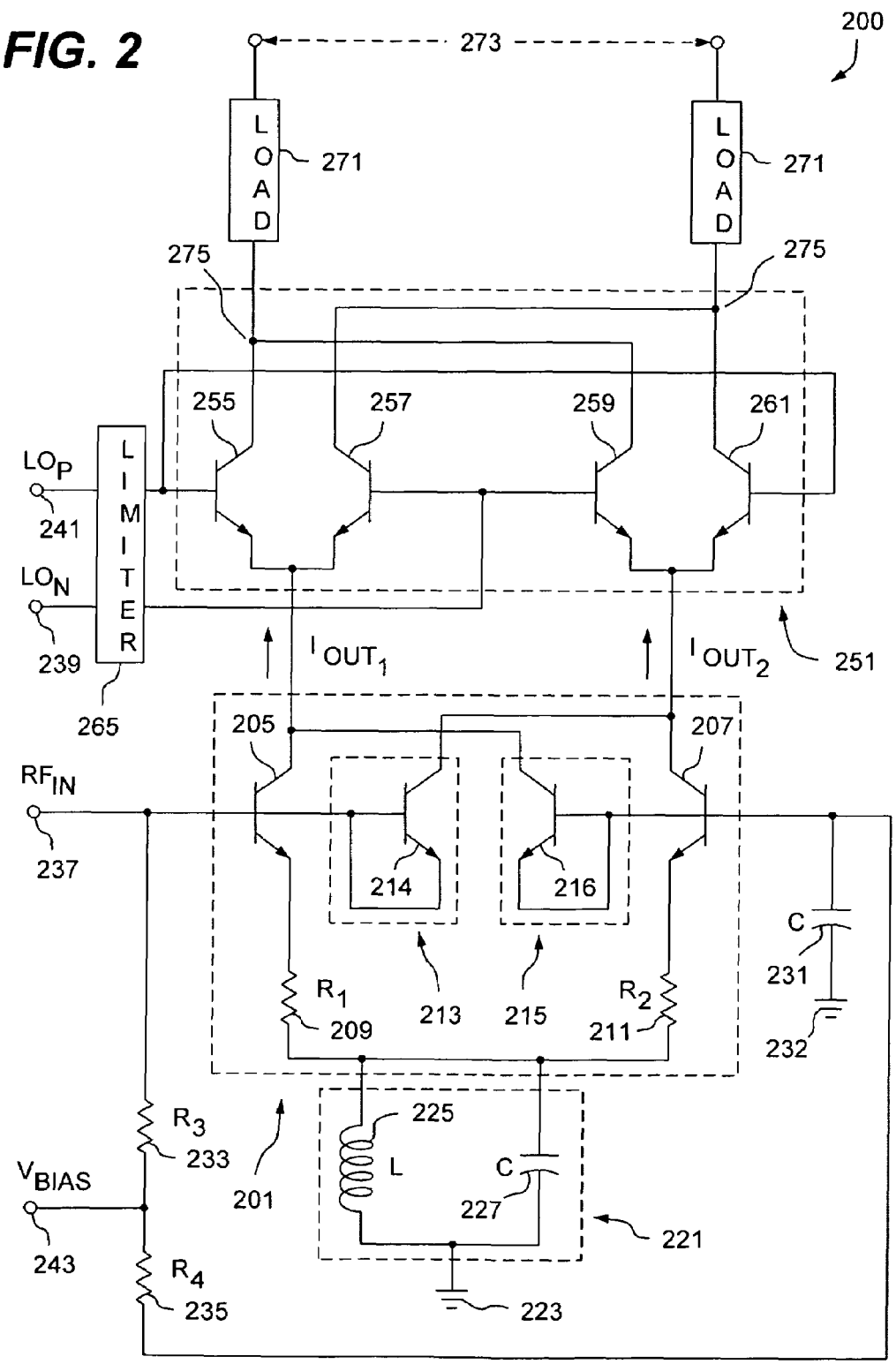
FIG. 2 is a circuit diagram illustrating a single-ended-to-differential mixer for converting a single-ended input signal to a differential output signal, in accordance with an exemplary embodiment of the present invention

These and other aspects of the present invention will now be described in greater detail. FIG. 2 is a circuit diagram illustrating a single-ended-to-differential mixer 200 for converting a single-ended input signal to a differential output signal, in accordance with an exemplary embodiment of the present invention. The single-ended-to-differential mixer 200 can include a differential input circuit 201. The differential input circuit can be configured to receive a single-ended input signal, such as single-ended input signal 237. According to exemplary embodiments, the single-ended input signal 237 can be a single-ended RF input signal, such as voltage signal $RF_{IN}$, although the single-ended input signal 237 can be any suitable type of electrical signal at any desired frequency. According to exemplary embodiments, one side of differential input circuit 201 can be connected to the single-ended input signal 237, while the other side can be, for example, AC grounded, such as through capacitor 231 connected to reference voltage 232 (e.g., ground).

According to exemplary embodiments, the differential input circuit 201 can be configured as a differential amplifier to convert the single-ended input signal 237 from, for example, a voltage signal to first and second signals, such as, for example, first and second current signals $I_{OUT1}$ and $I_{OUT2}$, respectively. The differential input circuit 201 can be any suitable combination of electrical or electronic components capable of converting the single-ended input signal 237 from a voltage signal to the first and second signals. For example, the differential input circuit 201 can be comprised of a first transistor 205 and a second transistor 207. The first and second transistors 205 and 207 can be configured as a differential amplifier pair. First and second transistors 205 and 207 can be any suitable type of transistor, such as a n-p-n or p-n-p junction transistor, a field-effect transistor (FET), metal-oxide semiconductor FET (MOSFET), or the like. According to exemplary embodiments, one side of differential input circuit 201 can be connected to the single-ended input signal 237, while the other side can be, for example, AC grounded, such as through capacitor 231 connected to reference voltage 232. For example, the base of the first transistor 205 can be connected to the single-ended input signal 237, while the base of the second transistor 207 can be, for example, AC grounded. According to an exemplary embodiment, the differential input circuit 201 can be formed on a monolithic substrate.

Additionally, the first and second transistors 205 and 207 can be biased by a constant bias voltage signal 243, such as, for example, $V_{BIAS}$, through resistors 233 and 235 that are respectively connected to the bases of first and second transistors 205 and 207. The amplitude of the bias voltage 243 and the values of the resistors 205 and 207 will depend on the amount of biasing desired. In addition, the differential input circuit 201 can include resistors 209 and 211 connected to the emitters of first and second transistors 205 and 207, respectively. Resistors 209 and 211 are degeneration resistors that can serve to reduce the gain and improve the input linearity of the differential amplifier of the differential input circuit 201. The resistors 209 and 211 should be chosen so as to provide an acceptable balance between gain and linearity, as large resistance values can improve linearity, but to the detriment of gain.

The system 200 can include a passive tank circuit, such as, for example, passive tank circuit 221. The passive tank circuit 221 can be in communication between a reference voltage 223 (e.g., ground or any other suitable reference voltage) and common emitters of the differential amplifier of the differential input circuit 201, such as the common emitters of first and second transistors 205 and 207. For example, passive tank circuit 221 can be connected to differential input circuit 201 using any suitable type of electrical connection capable of communicating electrical signals, such as, for example, a wire. According to an exemplary embodiment, the passive tank circuit 221 can be formed on a monolithic substrate, such as the same monolithic substrate as differential input circuit 201.

According to exemplary embodiments, the passive tank circuit 221 can be configured as a passive current source. As used herein, a "passive current source" is any suitable type of current source comprised of passive electrical elements, such as, for example, resistors, capacitors, and/or inductors, and not active electrical elements, such as transistors. According to exemplary embodiments, the passive tank circuit 221 can be any suitable type of passive current source comprised of any appropriate combination of passive electrical elements capable of providing a high impedance at a predetermined frequency of the single-ended input signal 237. The predetermined frequency can be any desired frequency of the single-ended input signal 237, such as, for example, any desired radio frequency used for wireless communication. According to exemplary embodiments, the passive tank circuit 221 can aid in the single-ended-to-differential signal conversion performed by differential input circuit 201 and improve the common mode rejection and linearity performance of the system 200, while maintaining the high gain of the differential input circuit 201.

According to an exemplary embodiment of the present invention, the passive tank circuit 221 can include an inductor, such as, for example, inductor 225. For example, at high frequencies, inductor 225 has a high impedance, so inductor 225 can act as a (passive) current source at such high frequencies. The passive tank circuit 221 can also include a tuning capacitor, such as, for example, capacitor 227, arranged in parallel with the inductor 225. For certain RF applications, the associated RF circuitry can be a narrowband system. Therefore, only a certain carrier band signal frequency within a certain narrow frequency band may be of interest. The inductor 225 and capacitor 227 can each be of any appropriate value. According to exemplary embodiments, the values of inductor 225 and capacitor 227 can be chosen so that the resonant frequency of the parallel combination of inductor 225 and capacitor 227 is substantially centered around the predetermined frequency of the single-ended input signal 237. In other words, the resonant frequency can be, for example, the predetermined frequency. At the resonant frequency, the LC circuit comprised of the parallel combination of inductor 225 and capacitor 227 can provide a high impedance so that the LC circuit acts as a (passive) current source at the resonant frequency. Using such a passive current source according to exemplary embodiments requires minimal voltage headroom from the system 200.

The system 200 can include a mixer circuit 251. According to exemplary embodiments, the mixer circuit 251 can be in communication with the differential input circuit 201 and configured to receive the first and second signals, such as first and second current signals $I_{OUT1}$ and $I_{OUT2}$. For example, the mixer circuit 201 can be connected to the collectors of first and second transistors 205 and 207 using any suitable type of electrical connection capable of communicating electrical signals, such as, for example, a wire. According to an exemplary embodiment, the mixer circuit 251 can be formed on a monolithic substrate, such as the same monolithic substrate as differential input circuit 201 and tank circuit 221. Additionally, the mixer circuit 251 can be configured to receive a second input signal. For example, the second signal can be comprised of a local oscillator signal, such as local oscillator signals 239 (denoted "$LO_N$") and 241 (denoted "$LO_P$").

According to exemplary embodiments, the mixer circuit 251 can be configured as a double-balanced switching mixer for generating a differential mixer output signal 275 that is the product of the first and second signals, such as first and second current signals $I_{OUT1}$ and $I_{OUT2}$, and the second input signal, such as local oscillator signals 239 and 241. The mixer circuit 251 can be any suitable type of double-balanced switching mixer capable of generating the differential mixer output signal 275. According to an exemplary embodiment, the mixer circuit 251 can be a Gilbert cell mixer. For example, the mixer circuit 251 can be comprised of a third transistor 255, a fourth transistor 257, a fifth transistor 259 and a sixth transistor 261 configured as a Gilbert cell mixer. In such a configuration, the common emitters of third and fourth transistors 255 and 257 can be connected to the collector of first transistor 205 of the differential amplifier of differential input circuit 201. The common emitters of fifth and sixth transistors 259 and 261 can be connected to the collector of second transistor 207 of the differential amplifier of differential input circuit 201.

Third, fourth, fifth and sixth transistors 255, 257, 259 and 261 can form a multiplication function that can multiply the first and second signals, such as first and second current signals $I_{OUT1}$ and $I_{OUT2}$ (e.g., positive and negative current signals, respectively), from first and second transistors 205 and 207, respectively, with the second input signal (e.g., local oscillator signals 239 and 241) applied across third, fourth, fifth and sixth transistors 255, 257, 259 and 261 to provide a switching function. More specifically, the first signal from first transistor 205 and its associated circuitry in the differential input circuit 201 can be switched between third and fourth transistors 255 and 257 in the mixer circuit 251. The second signal from second transistor 207 and its associated circuitry in the differential input circuit 201 can be switched between fifth and sixth transistors 259 and 261 in the mixer circuit 251. Such switching can produce a differential mixer intermediate frequency output signal (e.g., differential mixer output signal 275) when the system 200 is included in the receiver branch of a transmitter/receiver unit (e.g., when the single-ended input signal 237 is a radio frequency signal) or a differential mixer radio frequency output signal (e.g., differential mixer output signal 275) when the system 200 is included in the transmitter branch of a transmitter/receiver unit (e.g., when the single-ended input signal 237 is an intermediate frequency signal).

According to exemplary embodiments, two load resistors, such as loads 271, can form a current-to-voltage transformation to produce a differential output voltage signal. According to an alternative exemplary embodiment, the system 200 can include variable loads as loads 271. The loads 271 can be in communication with the mixer circuit 251 using any suitable type of electrical connection capable of communicating electrical signals. According to an exemplary embodiment, the loads 271 can be formed on a monolithic substrate, such as the same monolithic substrate as differential input circuit 201, passive tank circuit 221, and mixer circuit 251. The loads 271 can be configured to receive the differential mixer output signal 275. According to the alternative exemplary embodiment, the loads 271 can be configured to cause the gain of the system 200 to vary. In other words, using loads 271 in the output of mixer circuit 251, a variable gain of the system 200 can be achieved. For example, PMOS devices biased into deep linear region can be switched in parallel with a resistive load to reduce the effective load resistance to be, for example, −6 dB, −12 dB, −18 dB, or any other appropriate values, lower. The gate bias of the PMOS devices can be controlled by a feedback to adjust the effective resistance of the PMOS devices to the desired value. A DC power supply voltage ($V_{dd}$) 273 for the system 200 can be set at, for example, approximately 3V, or any other appropriate value.

According to an exemplary embodiment, to further improve the linearity performance of the system 200, the differential input circuit 201 can include a first cancellation circuit 213 and a second cancellation circuit 215. The first and second cancellation circuits 213 and 215 can be used in combination with or alternatively to the passive tank circuit 221. Each of the first and second transistors 205 and 207 can include a non-linear capacitance, e.g., the collector-to-base junction capacitance, commonly referred to as the Cμ capacitance. Since the single-ended input signal 237 can swing, a signal swing imposed across a non-linear capacitance can create non-linear components in the output signals. According to exemplary embodiments, first and second cancellation circuits 213 and 215 can aid in reducing the effect to linearity introduced by the non-linear capacitance.

The first and second cancellation circuits 213 and 215 can be configured to receive the single-ended input signal 237. For example, the first cancellation circuit 213 can be connected to single-ended input signal 237, while second cancellation circuit 215 can be, for example, AC grounded, such as through capacitor 231 connected to reference voltage 232. According to an exemplary embodiment, the first and second cancellation circuits 213 and 215 can each be comprised of a transistor. For example, first cancellation circuit 213 can be comprised of seventh transistor 214, and second cancellation circuit 215 can be comprised of eighth transistor 216. For each of these transistors, the emitter of the transistor can be in communication with the base of the transistor. In other words, the emitter of the seventh transistor 214 can be connected to the base of the seventh transistor 214, and the emitter of the eighth transistor 216 can be connected to the base of the eighth transistor 216. In addition, the collectors of the first and second cancellation circuits 213 and 215 can be in cross-communication with the collectors of the differential amplifier of the differential input circuit 201. Thus, the collector of seventh transistor 214 can be connected to the collector of second transistor 207, and the collector of eighth transistor 216 can be connected to the collector of first transistor 205. In such a configuration, the first and second cancellation circuits 213 and 215 can cancel the non-linear capacitance, e.g., the collector-to-base junction capacitance, associated with the differential amplifier (e.g., first transistor 205 and second transistor 207) of the differential input circuit 201. The first and second cancellation circuits 213 and 215 can be formed on a monolithic substrate, such as the same monolithic substrate as differential input circuit 201, passive tank circuit 221, and mixer circuit 251.

For the mixer circuit 251, when the swing of the second input signal (e.g., the local oscillator signals 239 and 241) is large, the noise contribution from the mixer circuit 251 can decrease. However, a larger swing of the local oscillator signal can increase the common emitter jitter and could degrade the linearity performance of the mixer circuit 251. Consequently, there can be an optimum swing range for a given mixer circuit 251. According to exemplary embodiments, the system 200 can include a limiter circuit 265 in communication with the mixer circuit 251. The limiter circuit 265 can be connected to mixer circuit 251 using any suitable type of electrical connection capable of communicating electrical signals, such as, for example, a wire. According to an exemplary embodiment, the limiter circuit 265 can be formed on a monolithic substrate, such as the same monolithic substrate as differential input circuit 201, first and second cancellation circuits 213 and 215, passive tank circuit 221 and mixer circuit 251. The limiter circuit 265 can limit the swing range of the local oscillator signal applied to the mixer circuit 251. The limiter circuit 265 can act as a buffer between the local oscillator providing the local oscillator signal and mixer circuit 251. The limiter circuit 265 can be any suitable combination of electrical or electronic components or devices capable of limiting the swing range of the local oscillator signal applied to the mixer circuit 251.

According to exemplary embodiments, the system 200 can comprise, for example, a mixer portion of a wireless transceiver, although system 200 can be used in any suitable wired and wireless system. In addition, the system 200 can be compliant with a standard selected from the group consisting of 802.11, 802.11a, 802.11b, 802.11g and 802.11i, or any other suitable wired or wireless standard.

Figure 3A:
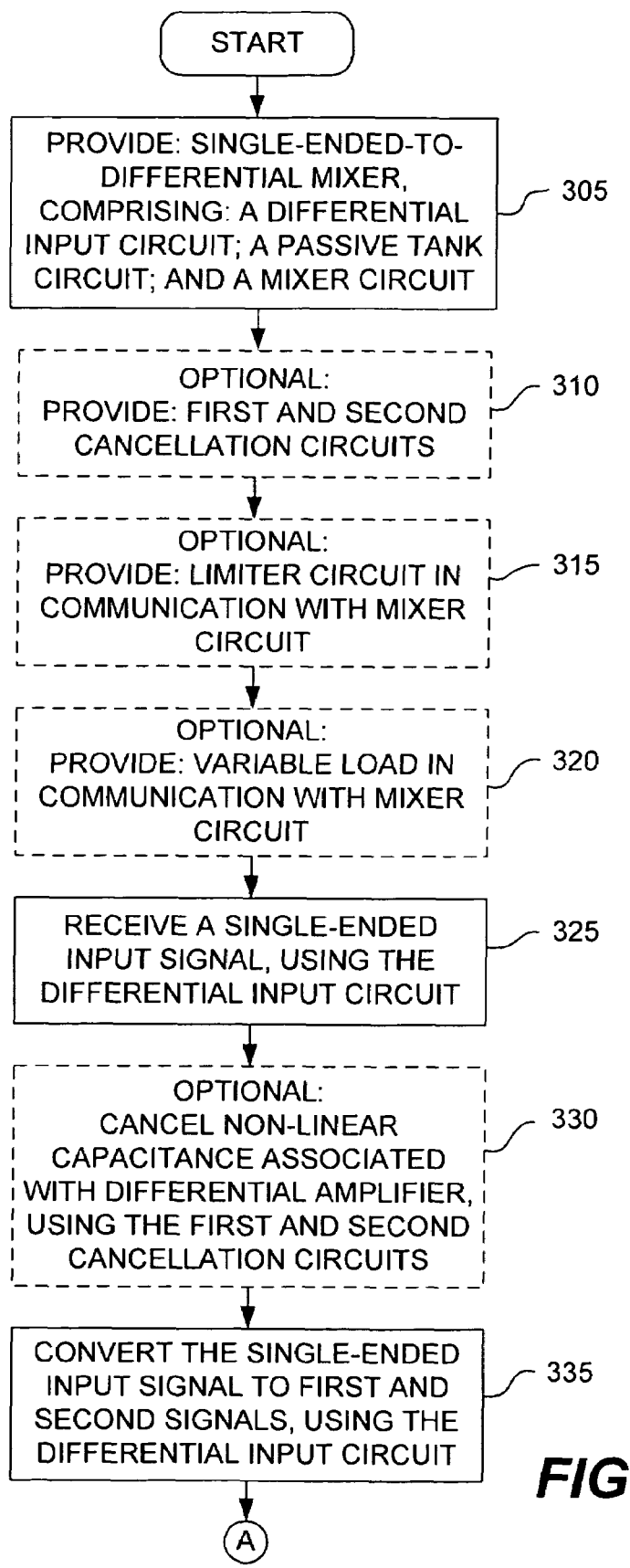
FIGS. 3A and 3B are flowcharts illustrating steps for converting a single-ended input signal to a differential output signal, in accordance with an exemplary embodiment of the present invention.
Figure 3B:
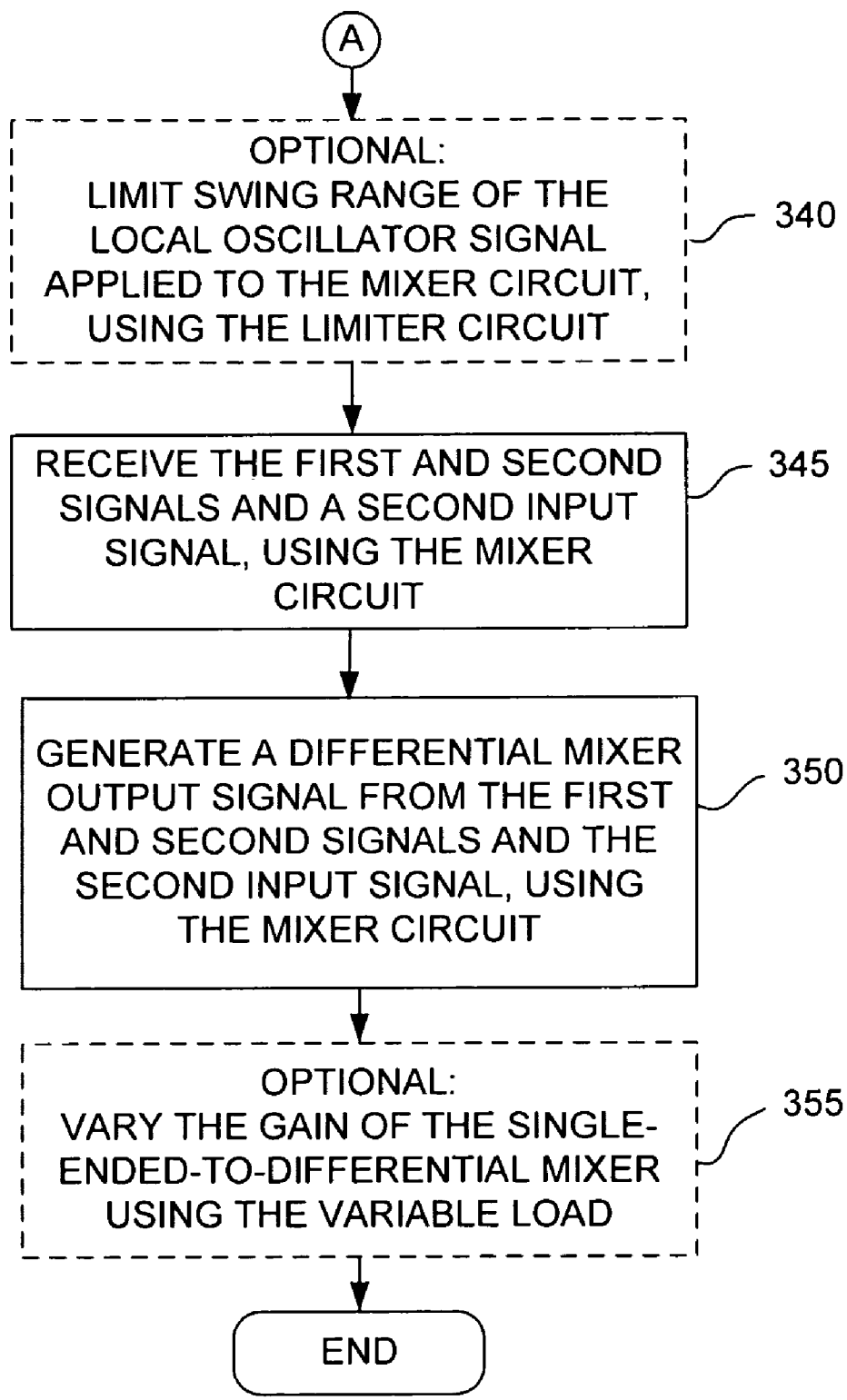

FIGS. 3A and 3B are flowcharts illustrating steps for converting a single-ended input signal to a differential output signal, in accordance with an exemplary embodiment of the present invention. In step 305, a single-ended-to-differential mixer can be provided. The single-ended-to-differential mixer can include a differential input circuit having a single-ended input that can be configured as a differential amplifier. According to an exemplary embodiment, the differential amplifier can comprise a first transistor and a second transistor configured as a differential amplifier pair. The single-ended-to-differential mixer can include a passive tank circuit in communication between a reference voltage and common emitters of the differential amplifier of the differential input circuit. According to exemplary embodiments, the passive tank circuit can be configured as a passive current source. The passive tank circuit can provide a high impedance at a predetermined frequency of a single-ended input signal. According to an exemplary embodiment, the passive tank circuit can comprise an inductor. The passive tank circuit can further comprise a tuning capacitor arranged in parallel with the inductor. According to exemplary embodiments, the resonant frequency of the inductor and tuning capacitor can be substantially centered around the predetermined frequency of the single-ended input signal. The single-ended-to-differential mixer can also include a mixer circuit in communication with the differential input circuit. The mixer circuit can be configured as a double-balanced switching mixer. For example, the mixer circuit can comprise a Gilbert cell mixer.

Optionally, in step 310 of FIG. 3A, a first cancellation circuit and a second cancellation circuit can be provided. The first and second cancellation circuits can be configured to receive a single-ended input signal. The single-ended input signal can comprise, for example, a single-ended radio frequency (RF) input signal, or any other suitable type of single-ended input signal of any appropriate frequency. According to exemplary embodiments, the first and second cancellation circuits can each comprise a transistor. For each transistor, an emitter of the transistor can be in communication with a base of the transistor. According to exemplary embodiments, collectors of the transistors of each of the first and second cancellation circuits can be in cross-communication with collectors of a differential amplifier of a differential input circuit. Optionally, in step 315, a limiter circuit in communication with a mixer circuit can be provided. Optionally, in step 320, a variable load in communication with the mixer circuit can be provided.

In step 325, the single-ended input signal can be received using the differential input circuit. Optionally, in step 330, non-linear capacitance associated with the differential amplifier, e.g., the collector-to-base junction capacitance, can be canceled using the first and second cancellation circuits. In step 335, the single-ended input signal can be converted to first and second signals using the differential input circuit. For example, the first and second signals can be first and second signals, and the differential input circuit can be configured as a differential amplifier to convert a voltage signal to the first and second current signals.

Optionally, in step 340 of FIG. 3B, the swing range of the local oscillator signal applied to the mixer circuit can be limited using the limiter circuit. In step 345, the first and second signals and a second input signal can be received using the mixer circuit. According to an exemplary embodiment, the second input signal can comprise a local oscillator signal. In step 350, a differential mixer output signal can be generated from the first and second signals and the second input signal, using the mixer circuit. Optionally, in step 355, the gain of the single-ended-to-differential mixer can be varied using the variable load.

According to exemplary embodiments, at least the differential input circuit, the passive tank circuit and the mixer circuit can be formed on a monolithic substrate. For example, the first and second cancellation circuits can also be formed on the same monolithic substrate. According to exemplary embodiments, the single-ended-to-differential mixer can comprise a mixer portion of a wireless transceiver, although exemplary embodiments of the present invention can be used in any suitable wired and wireless application. Additionally, the method according to exemplary embodiments can be compliant with a standard selected from the group consisting of 802.11, 802.11a, 802.11b, 802.11g and 802.11i, or any other suitable wired or wireless standard.

Figure 4A:
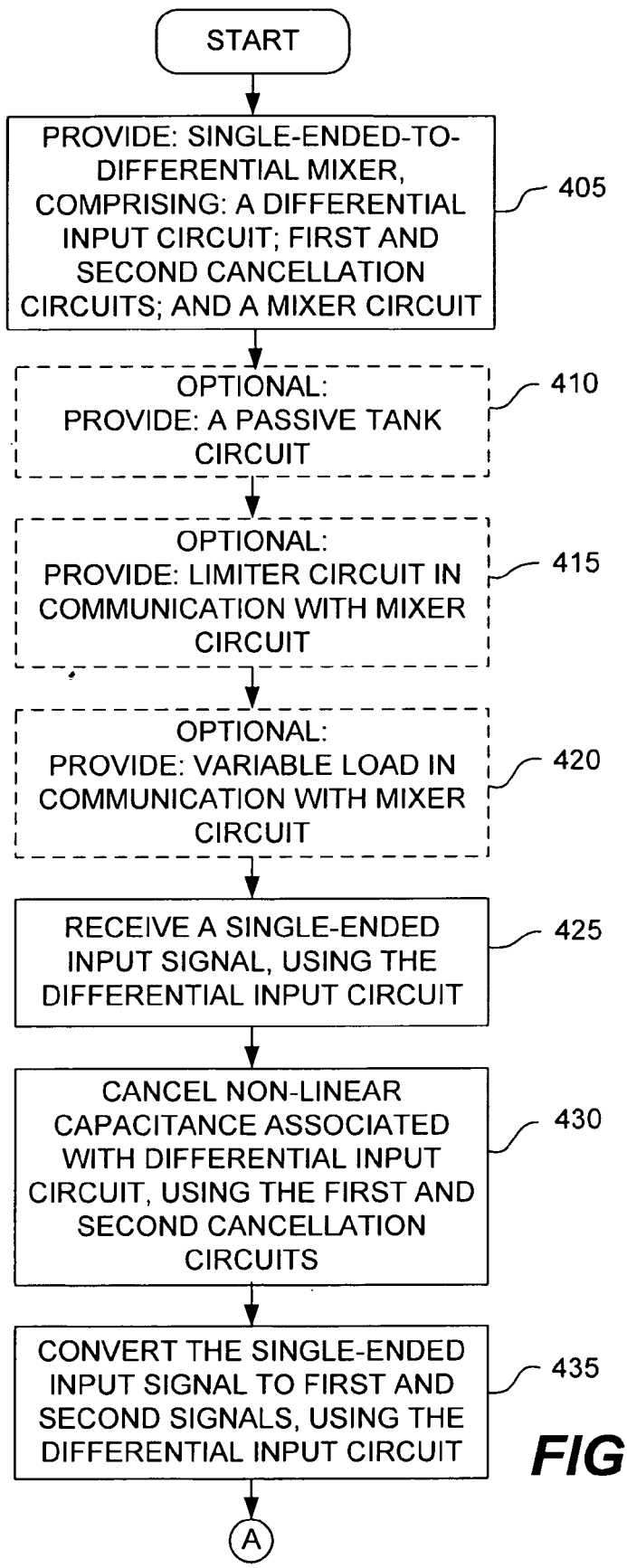
FIGS. 4A and 4B are flowcharts illustrating steps for converting a single-ended input signal to a differential output signal, in accordance with an alternative exemplary embodiment of the present invention.
Figure 4B:
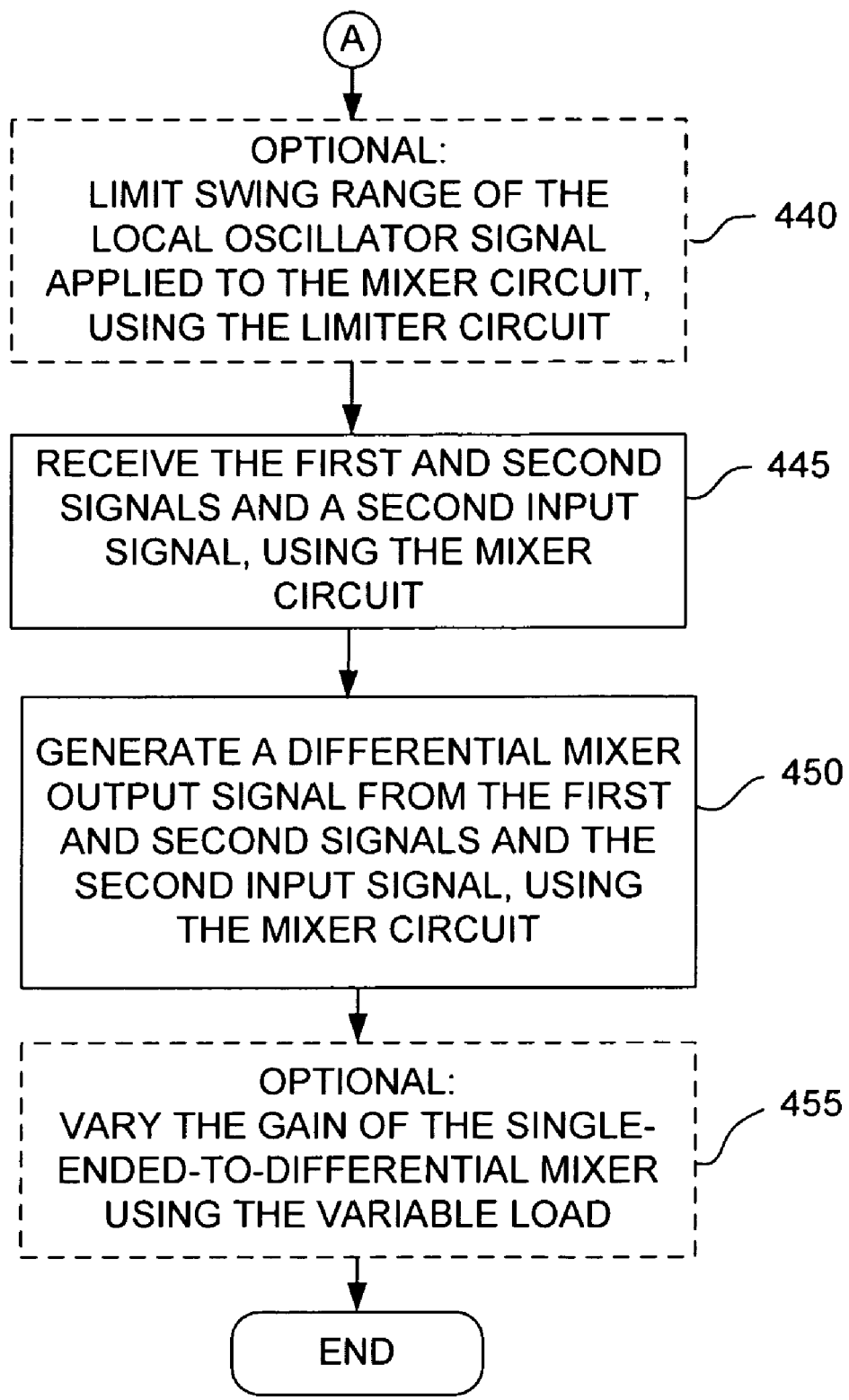

FIGS. 4A and 4B are flowcharts illustrating steps for converting a single-ended input signal to a differential output signal, in accordance with an alternative exemplary embodiment of the present invention. In step 405 of FIG. 4A, a single-ended-to-differential mixer can be provided. The single-ended-to-differential mixer can include a differential input circuit having a single-ended input. According to an exemplary embodiment, the differential input circuit can comprise a first transistor and a second transistor configured as a differential amplifier pair. The single-ended-to-differential mixer can include a first cancellation circuit and a second cancellation circuit. The first and second cancellation circuits can be responsive to the single-ended input signal. The single-ended input signal can comprise, for example, a single-ended radio frequency (RF) input signal, or any other suitable type of single-ended input signal of any appropriate frequency. According to exemplary embodiments, the first and second cancellation circuits can each comprise a transistor. For each transistor, an emitter of the transistor can be in communication with a base of the transistor. The first and second cancellation circuits can be in cross-communication with the differential input circuit. For example, collectors of the transistors of each of the first and second cancellation circuits can be in cross-communication with collectors of the differential input circuit. The single-ended-to-differential mixer can also include a mixer circuit in communication with the differential input circuit. The mixer circuit can be configured as a double-balanced switching mixer. For example, the mixer circuit can comprise a Gilbert cell mixer.

Optionally, in step 410, a passive tank circuit can be provided. The passive tank circuit can be in communication between a reference voltage and the differential input circuit. The passive tank circuit can provide a high impedance at a predetermined frequency of the single-ended input signal. According to an exemplary embodiment, the passive tank circuit can comprise an inductor. The passive tank circuit can further comprise a tuning capacitor arranged in parallel with the inductor. According to exemplary embodiments, the resonant frequency of the inductor and tuning capacitor can be substantially centered around the predetermined frequency of the single-ended input signal. Optionally, in step 415, a limiter circuit in communication with the mixer circuit can be provided. Optionally, in step 420, a variable load can be provided. The variable load can be in communication with the mixer circuit and responsive to a differential mixer output signal.

In step 425, the single-ended input signal can be received using the differential input circuit. In step 430, non-linear capacitance associated with the differential input circuit, e.g., the collector-to-base junction capacitance of the differential amplifier, can be canceled using the first and second cancellation circuits. In step 435, the single-ended input signal can be converted to first and second signals using the differential input circuit. For example, the first and second signals can be first and second signals, and the differential input circuit can be configured as a differential amplifier to convert a voltage signal to the first and second current signals.

Optionally, in step 440 of FIG. 4B, the swing range of the local oscillator signal applied to the mixer circuit can be limited using the limiter circuit. In step 445, the first and second signals and a second input signal can be received using the mixer circuit. According to an exemplary embodiment, the second input signal can comprise a local oscillator signal. In step 450, a differential mixer output signal can be generated from the first and second signals and the second input signal, using the mixer circuit. According to exemplary embodiments, the mixer circuit can be configured as a double-balanced switching mixer for generating the differential mixer output signal as a product of the first and second current signals and the second input signal. Optionally, in step 455, the gain of the single-ended-to-differential mixer can be varied using the variable load.

According to exemplary embodiments, at least the differential input circuit, the first and second cancellation circuits and the mixer circuit can be formed on a monolithic substrate. For example, the passive tank circuit can also be formed on the same monolithic substrate. According to exemplary embodiments, the single-ended-to-differential mixer can comprise a mixer portion of a wireless transceiver, although exemplary embodiments of the present invention can be used in any suitable wired and wireless application. Additionally, the method according to exemplary embodiments can be compliant with a standard selected from the group consisting of 802.11, 802.11a, 802.11b, 802.11g and 802.11, or any other suitable wired or wireless standard.

Exemplary embodiments of the present invention can be used in any device or system that communicates information, including both wired and wireless communication systems, particularly where a high linearity performance, high gain, single-to-differential signal mixer can be used in a transceiver system. For example, exemplary embodiments can be used in cellular telephone and other wireless communication devices.

It will be appreciated by those of ordinary skill in the art that the present invention can be embodied in various specific forms without departing from the spirit or essential characteristics thereof. The presently disclosed embodiments are considered in all respects to be illustrative and not restrictive. The scope of the invention is indicated by the appended claims, rather than the foregoing description, and all changes that come within the meaning and range of equivalence thereof are intended to be embraced.

All United States patents and applications, foreign patents, and publications discussed above are hereby incorporated herein by reference in their entireties.

What is claimed is:

1. A mixer, comprising:
a differential input circuit that is configured to receive an input signal and that comprises:

a first transistor and a second transistor configured as a differential amplifier to convert the input signal from at least one voltage signal to first and second current signals; and a first cancellation circuit and a second cancellation circuit, wherein the first cancellation circuit comprises a third transistor including an emitter that communicates with a base of the third transistor, wherein the second cancellation circuit comprises a fourth transistor including an emitter that communicates with a base of the fourth transistor, wherein the first and second cancellation circuits are configured to receive the input signal, wherein collectors of the first and second cancellation circuits are in cross-communication with collectors of the differential amplifier of the differential input circuit, and wherein the first and second cancellation circuits cancel non-linear capacitance associated with the differential amplifier;

a tank circuit that comprises a tuning capacitor arranged in parallel with an inductor, wherein a resonant frequency of the inductor and tuning capacitor is substantially centered around a predetermined frequency of the input signal, wherein the tank circuit is in communication between a ground and common emitters of the differential amplifier of the differential input circuit, and wherein the tank circuit is configured as a passive current source; and a mixer circuit that communicates with the differential input circuit and that is configured to receive the first and second current signals and a second input signal, and wherein the mixer circuit is configured as a Gilbert cell double-balanced switching mixer for generating a differential mixer output signal as a product of the first and second current signals and the second input signal.

2. The mixer of claim 1 wherein the input signal comprises a radio frequency input signal.

3. The mixer of claim 1 wherein the tank circuit provides a high impedance at the predetermined frequency of the input signal.

4. The mixer of claim 1 wherein the second input signal comprises a local oscillator signal.

5. The mixer of claim 4 comprising:
a limiter circuit in communication with the mixer circuit and configured to receive the local oscillator signal,
wherein the limiter circuit limits a swing range of the local oscillator signal applied to the mixer circuit.

6. The mixer of claim 1 comprising:
a variable load in communication with the mixer circuit and configured to receive the differential mixer output signal,
wherein the variable load is configured to cause the gain of the mixer to vary.

7. The mixer of claim 1 wherein at least the differential input circuit, the tank circuit and the mixer circuit are formed on a monolithic substrate.

8. The mixer of claim 7 wherein the first cancellation circuit and the second cancellation circuit are formed on the monolithic substrate.

9. A wireless transceiver comprising the mixer of claim 1.

10. The mixer of claim 9 wherein the wireless transceiver is compliant with a standard selected from the group consisting of 802.11, 802.11a, 802.11b, 802.11g and 802.11i.

11. A mixer, comprising:
a differential input circuit that is responsive to at least one input signal to generate first and second signals;

a first cancellation circuit and a second cancellation circuit, wherein the first and second cancellation circuits are responsive to the input signal, wherein the first and second cancellation circuits are in cross-communication with the differential input circuit, and wherein the first and second cancellation circuits cancel non-linear capacitance associated with the differential input circuit; and a mixer circuit that communicates with the differential input circuit and that is responsive to the first and second signals and a second input signal to generate a differential mixer output signal.

12. The mixer of claim 11 wherein the differential input circuit comprises a first transistor and a second transistor configured as a differential amplifier pair.

13. The mixer of claim 11 wherein the input signal comprises a radio frequency input signal.

14. The mixer of claim 11 wherein the first and second cancellation circuits each comprise a transistor,
wherein, for each transistor, an emitter of the transistor is in communication with a base of the transistor, and
wherein collectors of the transistors of each of the first and second cancellation circuits are in cross-communication with collectors of the differential input circuit.

15. The mixer of claim 11 wherein the first and second signals comprise first and second current signals, respectively,
wherein the differential input circuit is configured as a differential amplifier to convert the input signal from at least one voltage signal to the first and second current signals, and
wherein the mixer circuit is configured as a double-balanced switching mixer for generating the differential mixer output signal as a product of the first and second current signals and the second input signal.

16. The mixer of claim 11 wherein the differential input circuit further comprises:
a passive tank circuit,
wherein the passive tank circuit is in communication between a reference voltage and the differential input circuit.

17. The mixer of claim 16 wherein the passive tank circuit provides a high impedance at a predetermined frequency of the input signal.

18. The mixer of claim 16 wherein the passive tank circuit comprises an inductor.

19. The mixer of claim 18 wherein the passive tank circuit further comprises a tuning capacitor arranged in parallel with the inductor,
wherein a resonant frequency of the inductor and tuning capacitor is substantially centered around a predetermined frequency of the input signal.

20. The mixer of claim 11 wherein the mixer circuit comprises a Gilbert cell mixer.

21. The mixer of claim 11 wherein the second input signal comprises a local oscillator signal.

22. The mixer of claim 21 comprising:
a limiter circuit in communication with the mixer circuit and responsive to the local oscillator signal,
wherein the limiter circuit limits a swing range of the local oscillator signal applied to the mixer circuit.

23. The mixer of claim 11 comprising:

a variable load in communication with the mixer circuit and responsive to the differential mixer output signal, wherein the variable load is configured to cause the gain of the mixer to vary.

24. The mixer of claim 11 wherein at least the differential input circuit, the first and second cancellation circuits, and the mixer circuit are formed on a monolithic substrate.

25. The mixer of claim 24 wherein a passive tank circuit is formed on the monolithic substrate.

26. A wireless transceiver comprising the mixer of claim 11.

27. The mixer of claim 26 wherein the wireless transceiver is compliant with a standard selected from the group consisting of 802.11, 802.11a, 802.11b, 802.11g and 802.11i.

* * * * *